United States Patent [19]

Spacer

[11] Patent Number: 4,654,116
[45] Date of Patent: Mar. 31, 1987

[54] METHOD FOR PRODUCING HIGH RESOLUTION ETCHED CIRCUIT PATTERNS FROM CLAD LAMINATES

[75] Inventor: Edward T. Spacer, Harleysville, Pa.

[73] Assignee: American Electronic Laboratories, Inc., Lansdale, Pa.

[21] Appl. No.: 669,920

[22] Filed: Nov. 9, 1984

[51] Int. Cl.[4] .................................................. B44C 1/22
[52] U.S. Cl. ................................ 156/656; 156/659.1; 156/664; 156/902; 252/79.2; 204/32.1
[58] Field of Search ................................ 252/79.2, 79.5; 156/634, 638, 628, 664, 666, 668, 659.1, 902, 656, 650, 651, 629, 630; 333/121, 128, 136, 246; 204/32.1; 134/3, 28, 41

[56] References Cited

U.S. PATENT DOCUMENTS

| | | | |
|---|---|---|---|
| Re. 29,181 | 4/1977 | Dixon | 156/656 |
| 2,908,557 | 10/1959 | Black et al. | 252/79.2 X |
| 3,037,896 | 6/1962 | Gauntt et al. | 156/650 X |
| 3,411,965 | 11/1968 | Hobaica | 156/668 X |
| 3,653,997 | 4/1972 | Rothschild | 252/79.2 |
| 3,728,177 | 4/1973 | Caule | 156/629 |
| 3,955,156 | 5/1976 | Fleming | 333/246 X |
| 4,046,620 | 9/1977 | Andrascek et al. | 156/651 X |
| 4,159,917 | 7/1979 | Gluck | 148/1.5 |
| 4,430,154 | 2/1984 | Stahl et al. | 156/902 X |

FOREIGN PATENT DOCUMENTS 58-81973  5/1983  Japan ........................... 156/650

Primary Examiner—David Simmons
Assistant Examiner—Ramon R. Hoch
Attorney, Agent, or Firm—Seidel, Gonda, Goldhammer & Abbott

[57] ABSTRACT

A method for producing high resolution etched circuit patterns from a metal clad laminate of a conductive species on a nonconductive substrate is provided. The laminate is etched with an etchant solution for the conductive species to form a circuit pattern. The etched laminate is contacted with an oxidizing agent and aqueous acid to remove redeposited conductive species from the exposed substrate adjacent the circuit pattern. The side walls of the resulting circuit pattern are substantially vertical and free of "halo".

18 Claims, 4 Drawing Figures

METHOD FOR PRODUCING HIGH RESOLUTION ETCHED CIRCUIT PATTERNS FROM CLAD LAMINATES

FIELD OF THE INVENTION

The present invention relates to a method of making etched circuit patterns of improved resolution from laminates of a conducting species of a nonconductive substrate. More particularly, it relates to a method wherein redeposition of conductive species from the etched substrate surface is essentially eliminated.

BACKGROUND OF THE INVENTION

The use of laminates of a conductive species adhered to flexible nonconductive substrates to form etched circuit patterns is gaining widespread use, particularly in the preparation of microwave integrated circuits. However, circuit patterns prepared from such laminates or "circuit board" material currently commercially available often fail to provide circuits of the requisite high degree of resolution for microwave application.

Etched circuit patterns are typically generated by etching away unmasked conductive material with a solution of suitable etchant. In the final stages of the etching process, a portion of the conductive species which has been etched away may redeposit on the exposed substrate surfaces adjacent the circuit pattern. Although redeposition generally occurs to some degree over the entire exposed substrate surface, it is generally deepest at the base of the walls of the etched pattern. Upon plating of the pattern with protecting layers of metals, the plating materials effectively attach not only to the conductive pattern, but also to the redeposited conductive material lying adjacent thereto. The result is a widening of the circuit pattern or "halo" effect which drastically impairs the performance of the circuit pattern, particularly for microwave applications. What is needed is a method of eliminating redeposited conductive species during the etching process to insure that the circuit pattern side walls and adjacent exposed substrate surfaces are essentially free of redeposited conductive material.

SUMMARY OF THE INVENTION

According to the present invention, an electrically conductive circuit pattern is formed from a metal clad laminate of a conductive species on a nonconductive substrate. The laminate is etched with an etchant solution for the conductive species to form a circuit pattern. The etched laminate is contacted with an oxidizing agent. Thereafter, the etched laminate is contacted with an aqueous acid to remove redeposited conducting species from the exposed substrate adjacent the circuit pattern. The sidewalls of the resulting circuit pattern are substantially vertical. The resulting circuit pattern may then be plated with one or more layers of plating metals with no resultant halo.

The etched laminate is preferably rinsed with excess deionized water following contact with the oxidizing agent, and again following contact with the acid. The preferred oxidizing agent is a stabilized solution of hydrogen peroxide, heated to between about 40° C. and 65° C. The preferred acid is hydrochloric acid.

Accordingly, it is an object of this invention to provide a method of making an electrically conductive circuit pattern etched from a metal clad laminate of a conductive species on a nonconductive substrate whereby the exposed substrate adjacent the circuit pattern is essentially free of redeposited conductive species.

It is an object of this invention to provide a method of making an electrically conductive circuit pattern etched from a metal clad laminate of a conductive species on a nonconductive substrate whereby the side walls of the circuit pattern are substantially vertical.

It is a further object to provide a plated circuit pattern free of halo.

Other objects and advantages of the invention will become apparent from the following drawings and detailed description of the invention.

DETAILED DESCRIPTION OF THE INVENTION

Figure 1:
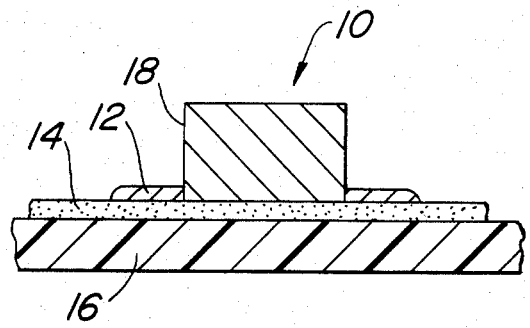
FIG. 1 is a cross-sectional view of a prior art etched circuit pattern.

By "stabilized hydrogen peroxide" is meant herein an aqueous solution of hydrogen peroxide in distilled water, said solution not to exceed 30% hydrogen peroxide by volume.

According to the present invention, a metal clad laminate of a conductive species on a nonconductive substrate is etched with an etchant solution for the conductive species to form a circuit pattern. Although I have used only copper clad laminates according to the present invention, I believe that my process for preparing substantially halo-free etched circuits is applicable to laminates of other conductive species. Copper laminates of flexible nonconductive substrate materials are commercially available in a wide variety of materials. The process of the present invention has application with all such materials. Laminates of polyester and polyamide are widely used. Particularly useful are laminates of polytetrafluoroethylene ("TEFLON"), or polytetrafluoroethylene impregnated with woven glass or fiberglass, sandwiched between copper foil layers which are bonded or glued to the substrate material. Examples of such commercial laminates are those available from Rogers Corporation, Chandler, Ariz. as "DUROID 5880"; from Minnesota Mining & Manufacturing Co. as "COPPER CLAD 250"; and from the Chase Foster Division of Keene Corporation, Newark, Del., as "DI CLAD 870". Also useful are copper laminates of a substrate of polytetrafluoroethylene impregnated with ceramic particles, available from the same manufacturers as "DUROID 6010.2", "EPSILAM-10" and "DI CLAD 810", respectively. Any suitable laminate of a flexible substrate material capable of being etched into printed circuits may be used in the present process.

The circuit pattern to be etched from the laminate is generated according to conventional photoimaging techniques. Either positive or negative photoresists may be used. Typically, a positive-acting photoresist is applied uniformly in a thin layer on the laminate and dried throughly. A photomask with opaque image areas delineating the desired pattern is brought into close contact with the photoresist surface through the use of a vacuum frame or by mechanial means. With the photomask in place, the resist is exposed to a light source rich in ultraviolet radiation. The resist film beneath the clear areas of the photomask undergoes a chemical change that renders it soluble in a developing solution. After exposure, the resist-coated base is emersed in the developing solution which dissolves the exposed areas. The resist images may then be baked for greater chemical resistance.

A negative-acting photoresist is likewise applied uniformly in a thin layer on the laminate and dried thoroughly. A photomask with transparent image areas delineating the desired pattern is brought into close contact with the photoresist surface through the use of a vacuum frame or by mechanical means. The resist is exposed to a rich ultraviolet radiation light source. The resist film beneath the clear areas of the photomask undergoes a physical and chemical change which renders it insoluble in a developing solution. After exposure, the resist-coated base is emersed in the developing solution, which allows the unexposed areas to be removed without excessive effect on the hardened or exposed area. The resulting image can be further hardened by baking, or rendered more visible by dyeing, or both.

Prior to application of photoresist, the laminate is advantageously cleaned carefully. Inadequate cleaning results in poor adhesion between the metal surface and the photoresist.

A wide variety of cleansing processes and solutions are known to those skilled in the art. See, for example, chapter 3 of *Photoresist: Materials and Processes* by William S. DeForest, McGraw-Hill Book Co. (1975), which is incorporated herein by reference. I prefer a three-step cleaning process wherein the laminate is first immersed in an ultrasonic bath of a flux remover, followed by ultrasonic emersion in acetone, followed by ultrasonic immersion in a suitable acid cleaning solution. The flux remover may advantageously comprise a mixture of methylene chloride and methanol. I prefer a mixture of 95% methylene chloride and 5% methanol. Examples of suitable acid cleaning solutions include sulfuric acid (10% v/v), hydrochloric acid (15% v/v), and perchloric acid (5% v/v). Solutions of organic acids may also be used. Various proprietary acid cleaning solutions known to those skilled in the art may also be used. Care must be taken, however, not to dissolve away the conductive species prior to etching. Following immersion in the acid cleaning bath, the laminate is rinsed in deionized water, followed by immersion in dilute chromic acid and repeated rinsing in deionized water. The cleaned laminate may then be blown dry with nitrogen.

Photoresist materials useful in the present invention include all the positive and negative photoresists. Negative photoresists suitable for the generation of microwave circuitry include resins such as polyvinyl cinnamate and its derivatives, vinyl esters of cinnamylidene, allyl ester resins such as diallyl pthalate, and isoprenoid resins. Positive photoresists have been used in the electronics industry for only 20 years and are particularly useful for generation of microwave circuitry. Negative and positive resist materials are described, respectively, in chapters 4 and 5 of DeForest, *Photoresist: Materials and Processes*, which are specifically incorporated herein by reference. I have found that the proprietary positive photoresist formulation known as "AC-CULITH P-1007", manufactured by Allied Chemical Company, is particularly useful in the present invention. Other useful positive photoresist materials include "MICROPOSIT" (Shipley), "AZ" (American Hoescht) and "WAYCOAT" (Hunt Chemical Corp.). Other useful photoresit materials are manufactured by Kodak Company under a variety of trademarks. Still other photoresit materials are known to those skilled in the art.

The photoresist may be applied by the conventional techniques of roller coating, dip coating, flow coating and spinning. These methods are described in pages 89–101 (negative resists) and 132–146 (positive resists) of *Photoresist: Materials and Processes*, which are specifically incorporated herein by reference. When using the spin method, I prefer a spin speed of 2000 RPM. "AC-CULITH P-1007" is the preferred positive resist because of its ability to produce a thick coating (2.5 microns to 3.5 microns), or thicker, as required in a single pass through a roller coating device.

The circuit pattern may be imaged on the laminate with accurate photomasks by conventional photoimaging techniques. Photoimaging by columnated ultraviolet light between 250 and 500 nanometers is preferred. Exposure times may vary. For the thickness of laminates which I employ, an exposure time of 50 seconds is preferred for evaporated copper laminates. For foil copper laminates, 70 seconds is preferred. When using a positive photoresist, I prefer to use a Tamarack 500/1000 System emitting collumated light from a 500 watt mercury short arc lamp. Exposure may be performed in the contact mode, that is, mask and substrate are in contact with each other, or in the proximity or projection mode. The resist coating is stabilized prior to the exposure operation by heating in an air circulating oven. For positive photo resist materials such as "AC-CULITH P-1007", heating for about 30 minutes at 90° C.±5° C. as preferred.

Following exposure, the image is oven baked. Baking at 5 minute (±1 minute) at about 110° C. has been found to be particularly advantageous.

The image is then "developed", i.e. the unstabilized resist areas are removed by a suitable solvent for the resist material, and blown dry with nitrogen.

The conductive pattern is generated by etching the exposed copper by using any appropriate etchant formulated for the particular conductive species of the laminate material. A wide variety of such suitable etchants are known to those skilled in the art such as ferric chloride, ammonium persulfate, sodium sulfate, chromic acid, sulfuric acid, nitric acid, etc. For etching copper, I prefer to use a 30% solution of ferric chloride in deionized water. Etching of copper laminates is most advantageously performed in the following manner. The imaged laminate is first emersed in the ferric chloride solution, rinsed in deionized water, and blown dry with nitrogen. Generally, an immersion time of about 5 seconds in the ferric chloride solution is sufficient. The etched laminate is then baked in an oven at 120°±5° C. for about 30 minutes and allowed to cool to room temperature before proceeding further. Immersion and rinsing are repeated until substantially all the exposed copper is removed. Some areas of copper may etch faster than others. Thus, it may be necessary to selectively etch off the remaining exposed copper with a few drops of ferric chloride. As an alternative to emersion, the etchant solution may be applied by spraying.

Following etching, the photoresist must be removed from the surface of the etched circuit. Removal is performed by serially immersing the etched laminate in ultrasonic baths of various treating solutions. Thus, I prefer to immerse the etched laminate in suitable flux remover, then in acetone, then in a suitable acid cleaning solution, followed by rinsing in deionized water. Flux removing and acid cleaning solutions of the same type used in the substrate-cleaning process previously described herein may be advantageously employed in the present photoresist removal step. Following rinsing away of the acid cleaner, the etched laminate may be immersed in an ultrasonic bath of chromic acid solution (as was used in the substrate-cleaning process), followed by rinsing in deionized water and drying with nitrogen.

After photoresist removal, the etched substrate is contacted with an oxidizing agent to remove redeposited conductive species from the exposed substrate adjacent the circuit path. Any suitable oxidizing agent for the conductive species may be used, for example, hydrogen peroxide, ammonium hydroxide or potassium hydroxide. I prefer to use a stabilized solution of hydrogen peroxide, i.e. a solution of hydrogen peroxide in distilled water, not to exceed 30% (by volume). It is known by those in the art that concentrations exceeding 30% are unstable. It is also well known that the stability of hydrogen peroxide is greatly decreased by the presence of heavy metal ions. Stabilization becomes most significant where, as here, hydrogen peroxide is used as an etchant for copper, since dissolved copper favors highly active copper ion formation and rapid decomposition of hydrogen peroxide. Suitable stabilizers for hydrogen peroxide and disclosed in the following U.S. Pat. Nos. 4,040,863 to Kitamura; 3,905,907 to Shiga; 3,668,131 to Banush et al. I have found that a 30% (volume) solution of hydrogen peroxide is optimum.

Immersion time in the oxidizing solution may vary according to the identity of the particular conductive species. For copper laminates, I have found that an immersion time of 10 minutes is preferable using a 30% hydrogen peroxide solution. If weaker concentrations are employed, the immersion time must be increased proportionately. The solution should be heated to a temperature of between about 40° C. to about 65° C. For temperatures below 40° C., substantial etching by hydrogen peroxide does not take place. Above 65° C., there is little further increase in the rate of etching, and decomposition of hydrogen peroxide begins to occur. I prefer a temperature of about 50° C. to about 60° C., with a temperature of about 55° C. being most preferred. The solution temperature should be maintained at the appropriate level throughout the entire duration of immersion.

The laminate is next removed from the oxidizing bath and rinsed in overflowing deionized water. I prefer to use at least 18 meg ohm purity water. I have found that a rinsing time of 2-3 minutes is optimum. Following rinsing, the substrate is placed in a solution of hydrochloric acid in deionized water. I prefer a 10% solution of industrial (38%) hydrochloric acid in deionized water. Rinsing in overflowing deionized water is repeated.

The etched circuit may be plated with at least one protective layer of a suitable plating metal. Nickel or palladium may be used. The etched circuit may be further plated with a second layer of metal. I prefer to use gold for this purpose.

The invention will now be described in greater detail by reference to the following specific non-limiting examples wherein "deionized water" refers to deionized water of 18 meg ohm purity and "concentrated HCl" means 38% HCl.

EXAMPLE 1

A 2"×2" sample of 10.5–11.0 mil thickness "DUROID 5880" copper-clad laminate (Rogers Corporation, Chandler, Ariz.) in a teflon carrier was immersed in a beaker containing a flux remover solution comprising 95% methylene chloride and 5% methanol for 5 minutes in a Bronson (Smith-Kline-Beckman Co.) Model B220 Ultrasonic Cleaner. Acetone was then substituted for flux remover (5 minutes), followed by 5 minutes in a 2% solution of the proprietary acid cleaning solution "ACID CLEANER 880" (Shipley, Inc., Newton Falls, MA) in deionized water. The laminate was removed from the acid cleaner and immersed in a deionized water flow rinse with $N_2$ burst for two minutes. The laminate was then immersed in a 15% (by volume) solution of chromic acid in deionized water for 1 minute, followed by 30 seconds of rinsing in deionized water, and 2 minutes of further rinsing in $N_2$-saturated deionized water as before. The laminate was then blown dry with $N_2$. A layer of "ACCULITH P-1007" positive photoresist (Allied Chemical Co.) was applied to the cleansed laminate to a thickness of 2.5–3.5 microns using a Gyrex Model 9 Microcoater roller-coating device. The resist coating was stabilized in an air circulating oven at 90° C. for 30 minutes. The circuit pattern was generated with a Tamarack 500/1000 columated light source using a 500 watt mercury short arc lamp with 70 seconds of exposure time. The image was developed using a solution of 4 parts "D-155" (a proprietary developer concentrate of Allied Chemical Co.) to 11 parts deionized water. Etching was by a solution composed of 600 ml deionizd water and 300 ml 42°-baume ferric chloride, followed by rinsing in distilled water for 5 seconds, immersion in running deionized water for 1 minute and drying in $N_2$. Following etching, the rinsing was repeated as above. The etched laminate was then baked at 120° C. for 30 minutes and allowed to cool, after which rinsing was again repeated. The resist was then stripped from the circuit pattern by serial immersion of the laminate in the same ultrasonic baths described above, except that immersion in flux remover was for 9 minutes and immersion in chromic acid was for 1 minute. Redeposited copper was removed by immersing the laminate in 30% (by volume) stabilized $H_2O_2$ for 10 minutes, followed by rinsing in running deionized water for 2 minutes and blow drying with $N_2$. The laminate was immersed in a bath of a 10% solution of concentrated HCl in deionized water for 3 minutes, then rinsed in overflowing deionized water for 3 minutes.

The etched laminate of Example 1 was plated according to the following procedure.

Example 2

The etched laminate was cleaned for electroplating by immersing it in a bath containing 400 ml distilled water and 600 ml concentrated HCl, and rinsed in running deionized water. The laminate was then immersed in "PALLASPEED" palladium plating solution (Technic, Inc.) for 15 minutes at 10 ma current per square inch of surface to be plated and 0.5 volts, followed by rinsing for 1 minute in deionized water. The palladium surface was then activated for gold plating by immersion in a 15% solution of concentrated HCl in distilled water for 1 minute. The palladium-plated laminate was next immersed in a gold strike solution ("ACR-114", American Chemical and Refining Co.) for 1 minute at 10 ma/sq. inch and 0.5 V, followed by washing in 15% HCl as above. The laminate was next immersed in a gold plating solution ("OROTEMP 24", Technic, Inc.) for 15 minutes at 10 ma/sq. inch and 0.5 V. The laminate was washed again in 15% HCl. The double-plated laminate was then blown dry in nitrogen.

The plated circuit was examined under 30× and 50× magnification. Halo was absent. The side walls of the circuit pattern were substantially vertical.

EXAMPLE 3

The procedure of Examples 1-2 was followed except that redeposited copper was not removed prior to plating. The resultant circuit after plating had a measured halo varying between 1.6 and 3.4 mils thickness. The circuit was electrically inoperative.

In FIG. 1 there is shown a cross section of an etched circuit generally designated as 10 and formed according to the process of the prior art, that is, without removing redeposited conductive species following etching. Redeposited conductive species 12 occupies an area on the substrate adhesive layer 14 immediately adjacent the etched circuit wall 18. Substrate adhesive layer 14 binds the circuit 10 to the substrate 16.

Figure 2:
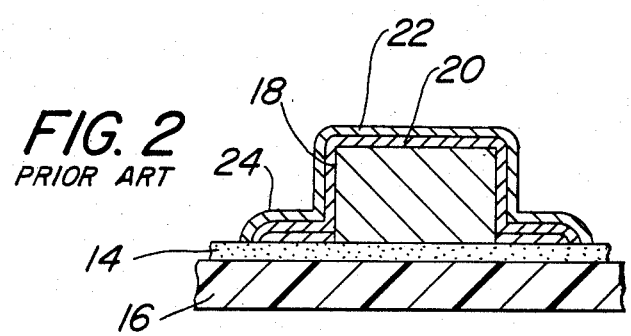
FIG. 2 is a cross-sectional view of the etched circuit pattern of FIG. 1 following plating.

In FIG. 2, the same etched circuit is shown after plating with a first layer of plating metal 20, and a second such layer 22. The plating material forms a continuous plating layer over the etched circuit and over the contiguous redeposited material, thereby giving rise to a "halo" 24 at the base of the circuit. I have measured the width of this halo and found it to be between 1.6 and 3.4 mils.

Figure 3:
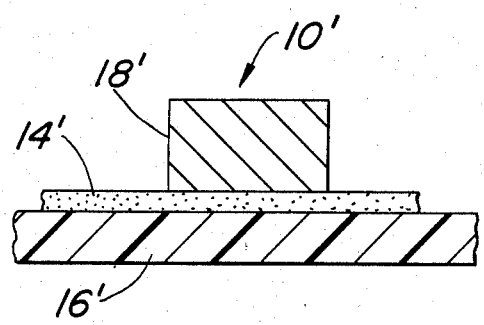
FIG. 3 is a cross-sectional of the etched circuit pattern of the present invention.
Figure 4:
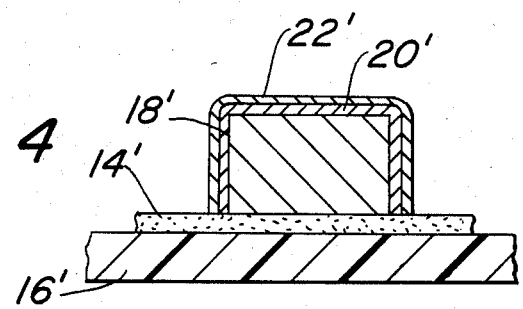
FIG. 4 is a cross-sectional view of the etched circuit pattern of FIG. 3 following plating.

FIGS. 3 and 4 show the corresponding circuit formed according to the process of the present invention wherein like primed numerals indicate like elements. The exposed substrate adjacent the etched circuit in FIG. 3 is substantially free of redeposited conductive species. The side walls of the plated circuit in FIG. 4 are substantially vertical as shown.

The present invention may be embodied in other specific forms without departing from the spirit or essential attributes thereof and, accordingly, reference should be made to the appended claims, rather than to the foregoing specification, as indicating the scope of the invention.

I claim:

1. A method for making an electrically conductive circuit pattern from a metal clad laminate comprised of a layer of a conductive species on a nonconductive substrate comprising:
   (a) etching said laminate with an etchant solution for the conductive species to form a circuit pattern in said layer of conductive species, wherein a portion of the conductive species which has been etched away redeposits on the exposed substrate surface adjacent said circuit pattern;
   (b) contacting the etched laminate with an oxidizing agent; and
   (c) thereafter contacting said etched laminate with an aqueous acid to remove said redeposited conductive species from the exposed substrate adjacent the circuit pattern.

2. A method according to claim 1 wherein the oxidizing agent is aqueous hydrogen peroxide heated to a temperature of between about 40° C. and about 65° C.

3. A method according to claim 2 wherein the aqueous acid is hydrochloric acid.

4. A method according to claim 3 wherein the etched laminate is rinsed in excess deionized water following steps (b) and (c).

5. A method according to claim 4 wherein the etched laminate is contacted with an aqueous solution of about 30% (v/v) hydrogen peroxide for about 10 minutes.

6. A method according to claim 4 wherein the temperatue of the hydrogen peroxide solution is between about 50° C. and about 60° C.

7. A method according to claim 2 wherein the laminate is prepared for etching to form the circuit pattern in step (a) by the steps of:
   (i) applying a photoresist coating to the conducting surface of the laminate;
   (ii) imaging a pattern onto the photoresist with photomasks and columnated ultraviolet light;
   (iii) heat treating the exposed photoresist to stabilize the patterned image; and
   (iv) removing the unstabilized area of said exposed photoresist by chemical solvent to expose the underlying conductive species.

8. A method according to claim 3 wherein the conductive species is copper.

9. A method according to claim 3 wherein the nonconductive substrate is polytetrafluoroethylene.

10. A method according to claim 9 wherein the polytetrafluorethylene is impregnated with woven glass.

11. A method according to claim 9 wherein the polytetrafluoroethylene is impregnated with fiberglass.

12. A method according to claim 9 wherein the polytetrafluoroethylene is impregnated with ceramic particles.

13. A method according to claim 3 further comprising the step of plating the circuit pattern with at least one protective layer of a plating metal.

14. A method according to claim 13 wherein the circuit pattern is coated with a first layer of a metal selected from the group consisting of nickel and paladium, followed by a second layer of gold.

15. A method according to claim 6 wherein an etched laminate of copper on a polytetrafluoroethylene substrate is immersed in a bath of about 30% aqueous hydrogen peroxide solution for about 10 minutes, maintaining said bath at a temperature from about 55° C. to about 60° C. during said immersion, rinsing said etched laminate in overflowing deionized water for about two minutes, immersing said etched laminate in about a 10% solution of concentrated hydrochloric acid in deionized water for about three minutes, and rinsing said etched laminate in overflowing deionized water for about three minutes.

16. A method according to claim 15 further comprising the step of plating the circuit pattern with a first layer of a metal selected from the group consisting of nickel and pladium, followed by a second layer of gold.

17. The method according to claim 1 wherein the electrically conductive circuit pattern is a microwave integrated circuit.

18. The method according to claim 7 wherein the electrically conductive circuit pattern is a microwave integrated circuit.